(12) United States Patent
Semenov

(10) Patent No.: US 6,608,581 B1
(45) Date of Patent: Aug. 19, 2003

(54) SUPERCONDUCTOR MODULATOR WITH VERY HIGH SAMPLING RATE FOR ANALOG TO DIGITAL CONVERTERS

(75) Inventor: Vasili Semenov, Stony Brook, NY (US)

(73) Assignee: Hypres, Inc., Elmsford, NY (US)

( * ) Notice: Subject to any disclaimer, the term of this patent is extended or adjusted under 35 U.S.C. 154(b) by 193 days.

(21) Appl. No.: 09/883,490

(22) Filed: Jun. 19, 2001

Related U.S. Application Data

(60) Provisional application No. 60/581,940, filed on Jun. 20, 2000.

(51) Int. Cl.$^7$ ................................................ H03M 1/36
(52) U.S. Cl. ...................................... 341/155; 341/159
(58) Field of Search ................................ 341/159, 160, 341/155, 158

(56) References Cited

U.S. PATENT DOCUMENTS 4,903,026 A * 2/1990 Tiemann ..................... 341/155
5,856,800 A * 1/1999 Le Pailleur ................. 341/159

* cited by examiner

Primary Examiner—Brian Young

(74) Attorney, Agent, or Firm—Pillsbury Winthrop LLP

(57) ABSTRACT

The invention provides an analog-to-digital modulator for converting an analog input signal to a digital output signal. The filter is constructed and arranged to subtract the feedback signal from the external input signal and to filter the subtracted signal such that the filter output signal is attenuated when the subtracted signal is outside said pass band. A plurality of superconducting comparators and digital-to-analog converters are utilized in a time-interleaved mode. The feedback loop filter, digital-to-analog converters, and superconducting comparators are arranged within a feedback loop such that the filter output signal from the feedback loop filter is communicated to the superconducting comparators such that the comparators generate Single Flux Quantum pulses- at their digital outputs. The pulses are communicated to the digital-to-analog converters and therein converted to analog signals. These signals are in turn combined into an integrated analog signal and communicated via the feedback loop back to the feedback loop filter, thereby effectively improving the resolution of the quantization performed by the comparators. The sampling times of the comparators are arranged such that the sequence in which each comparator samples the analog signal that is applied to its input is different for each comparator. The analog signals at the analog outputs of the digital-to-analog converters are generated and combined into an integrated analog signal such that each digital-to-analog converter contributes a different component of this integrated signal.

22 Claims, 9 Drawing Sheets

SUPERCONDUCTOR MODULATOR WITH VERY HIGH SAMPLING RATE FOR ANALOG TO DIGITAL CONVERTERS

CROSS REFERENCE TO RELATED APPLICATIONS

The present invention claims priority to U.S. Provisional Application No. 60/581,940 filed on Jun. 20, 2000.

BACKGROUND OF THE INVENTION

1. Field of the Invention

The present invention relates to superconductor analog-to-digital converters. More specifically, the present invention utilizes Single Flux Quantum and time-interleaving techniques to create a novel modulator for delta and delta-sigma analog-to-digital converters.

2. Background Information

An analog-to-digital converter (ADC) samples an analog signal at discrete time intervals and quantizes the amplitude of each sample. It outputs a digital code that represents each quantized amplitude. Traditionally, the analog signal is sampled at the Nyquist rate. The Nyquist rate is twice the frequency of the highest frequency component of the supplied signal and is the minimum rate of sampling required to digitally capture the signal.

The quantizing process inherently introduces error because of the uncertainty in determining the amplitude of a signal that falls between two quantizing levels. This quantization error becomes noise. Quantization error can be minimized by decreasing the spacing between quantizing levels and increasing the number of levels. This approach can place stringent demands on the analog components used, particularly since there are other sources of noise as well as interference. It is difficult to realize desirable ADC's in very large scale integration (VLSI) technology. Oversampling is one approach to dealing with this problem.

When a signal is oversampled the sampling rate is much higher than the Nyquist rate. This approach is beneficial because when a signal is sampled at a particular frequency, the noise power is spread out in a frequency range from zero to half the sampling frequency. When sampling at the Nyquist rate, this particular noise power is spectrally distributed over the signal bandwidth. Using oversampling, the same noise power is spectrally distributed over a bandwidth greater than the signal bandwidth. Therefore, for a significantly larger sampling frequency, the noise power within the signal band is significantly decreased. The demands on the analog components of an ADC can therefore be relaxed because more noise can be tolerated. Oversampling takes advantage of the fact that VLSI technology is better suited for providing fast digital circuits than for providing precise analog circuits.

Most early work on oversampling focused on delta modulators, which are based on generating and subtracting from the input signal the quantization error of a low-resolution quantizer placed in the forward path of a feedback loop. As shown in FIG. 1, high-speed oversampling within ADC 10 takes place within the modulator 12 with the use of high speed clock 28. A digital filter 14 smoothes the output of the modulator which attenuates noise, interference, and high-frequency components before the digital signal is sampled at the Nyquist rate, using the clock 26, by the register 16 for digital output to 24 as n-bit words. Within the modulator, digital code output is reconverted to an analog signal via a digital-to-analog converter (DAC) 22 prior to subtraction from the input signal. The resulting system predicts and corrects the next quantization error value. A filter placed in the return section of the feedback loop, shown as part of the integrated feedback loop filter block 20, causes the input signal at 30 and the quantization error to be filtered by the inverse of the loop filter transfer function. The subtraction of the feedback signal from the input signal as well as the filtering function both taking place within the integrated feedback loop filter 20. In the case of delta modulation the filtering is done prior to the subtraction.

Later work on oversampling focused on delta-sigma modulators because the circuits are more robust. These modulators are based on the principle of generating and subtracting the prior quantization error of the low resolution quantizer 18 from the input signal such that the output contains the original input signal plus the first difference of the quantization error. In this case, the filter is placed in the forward path of the feedback loop so the subtraction is done prior to the filtering within the integrated feedback loop filter 20.

The delta-sigma approach has the effect of leaving the input signal unchanged while significantly shifting the spectral distribution of the noise to outside the signal band, and is therefore called noise-shaping modulation. The noise within the input signal band is substantially shifted to outside the band. This effect contrasts with that of the noise predicting approach of delta modulation that changes the spectral distribution of the input signal while leaving that of the noise unchanged. However, the basic concept underlying both types of modulators is the use of feedback for improving the effective resolution of a coarse quantizer.

Due to the high sampling rates required by the oversampling approach, time-interleaving of the quantizer and DAC was introduced to allow conversion of larger bandwidth signals. The operation cycle of a quantizer consists of two phases: sample and hold. The quantizer is sensitive to the input signal only during the sampling phase. During the holding phase the quantizer calculates a digital code or more exactly compares the stored signal with a threshold value. The duration of the sampling phase defines the bandwidth and accuracy of the ADC and it should be as short as possible. The duration of the holding phase is also important because it defines the minimum clock period and therefore the oversampling ratio. Since the holding phase is relatively long, interleaving allows a higher sampling rate by using several quantizers that sample during each others holding phases.

Typical commercially available modulators allow for a bandwidth of a few kilohertz. Even with time-interleaving, the need for very high performance ADC's in the immediate future cannot be met by the semiconductor industry, therefore superconductor technology is being explored as a viable alternative.

DETAILED DESCRIPTION

Figure 1:
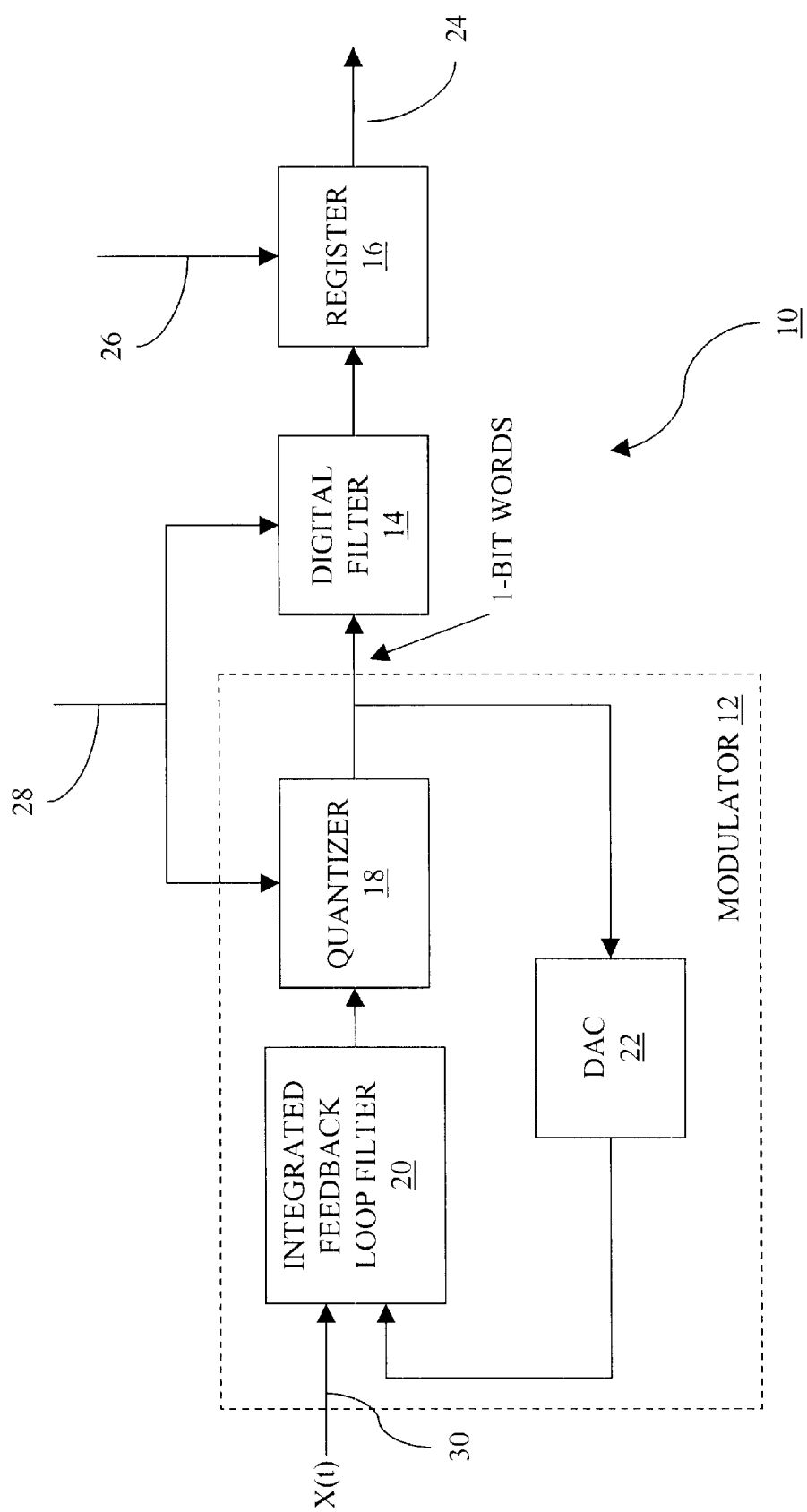
FIG. 1 is a signal-flow diagram of a delta-sigma modulator and analog-to-digital converter.

Superconductor Single Flux Quantum (SFQ) devices have been developed over the past few years and have been shown to be capable of ultra-fast processing at very low power consumption. These devices utilize Josephson junctions.

A Josephson junction is formed by creating a weak link (typically a tunnel junction) between two superconductors. The junction can switch between a superconducting state and a normal state over a time interval on the order of picoseconds. Since a change in the voltage across the junction accompanies this change in state, and the associated switching speed is much greater than that of a semiconducting junction, a significant potential exists for constructing superconductor logic circuits that operate much faster than semiconductor logic circuits.

The two superconductors surrounding the Josephson junction have different phases and therefore generate a current flow across the junction as a function of their phase difference, $\phi$ (where $\phi=\phi_1-\phi_2$) Specifically, the superconducting current is given by, $$I_s = I_c \sin \phi(t) \tag{1}$$

where $d\phi/dt = 2\pi V/\Phi_0$. $\Phi_0$ is one quantum of magnetic flux ($2.07\times10^{-15}$ Wb), $I_c$ is the junction's critical current, and V is the voltage across the junction. There are typically two types of currents across the junction; a direct, nondissipative super-current flows for V=0, and a dissipative normal current flows for V≠0. Additionally, for a changing V within the junction, there is a displacement current associated with a varying electric field. Adding all these components and writing V and the electric field in terms of $\phi$ gives the total current, $$I = I_c \sin \phi(t) + (\Phi_0 G/2\pi) \, d\phi/dt + (\Phi_0 C/2\pi) \, d^2\phi/dt^2 \tag{2}$$

where G is the conductance across the junction and C is the capacitance of the junction. Writing this equation in terms of dimensionless variables gives, $$i = \sin \phi(\tau) + d\phi/d\tau + \beta d^2\phi/d\tau^2, \tag{3}$$

where $i = I/I_c$, $\tau = 2\pi I_c/\Phi_0 G$, and $\beta = 2\pi I_c C/\Phi_0 G^2$. Equation 2 is readily seen as similar to that of a driven damped pendulum with I playing the role of the driving force, $\phi$ being equivalent to the displaced angle of the pendulum, G being similar to the damping force, and C being similar to the inertial mass. With a suitable choice of G, the junction can be made to operate in a mode that is critically-damped, over-damped, or under-damped, just as in the case of the pendulum. In equation 3, $\beta$ is known as the McCamber-Stewart parameter and gives an over-damped junction for $\beta<1$, and an under-damped junction for $\beta>1$ An under-damped junction is said to be hysteretic because even after the total flow of current, I, goes to zero (i.e. there is no driving force) $\phi$ still oscillates (due to the "Inertia") giving rise to an alternating voltage across the junction that takes some time to damp out. Eventually the junction does latch within the superconducting state, but the associated time delay can be significant. When current.is applied a similar oscillatory motion can occur before steady state equilibrium is reached. This oscillation can decrease the overall performance of the system.

There are two fundamental methods to construct Josephson junction digital circuits. The first is to view data in terms of the voltage state of the junction. In this case the digital circuits are designed to latch the junction in either the zero voltage state or in the non-zero voltage state. Since the non-zero voltage state requires a minimum conductance to prevent significant power consumption, and small G means small damping, this voltage latching approach requires an under-damped junction, which, as previously mentioned, can partially relinquish the speed advantage of superconducting logic circuits. The second method for construction Josephson junctions is to view data in terms of the magnetic fields (B-fields) produced by the superconducting currents circulating across the tunnel junctions within the logic circuit. Since a voltage pulse is associated with the generation and transfer of these fields, it is the transition between voltage states and not the states themselves that is important, allowing the use of over-damped junctions, and giving this approach an advantage over the latching approach.

In addition to being related to the voltage across the Josephson junction, $\phi$ is directly related to the vector potential of the magnetic field. Therefore, changes in $\phi$ are associated with changes in the magnetic flux as well as with changes in the voltage. However, since $\Phi_0$ is the most elementary unit of magnetic flux, also known as a single flux quantum (SFQ), the change in $\phi$ must be sufficient to generate at least one SFQ to effect a change in the flux.

The SFQ approach to manipulating data via over-damped Josephson junctions is known as Rapid Single Flux Quantum (RSFQ). A SFQ is generated by using a current to trigger a 2$\beta$change in $\phi$ across an over-damped junction. Typically the junction is biased with a current just below $I_c$ and then driven into the normal state (i.e. switched) with the addition of an input current (which sums the total current to above $I_c$). The SFQ that results can be detected and utilized in superconducting circuits via its associated voltage pulse.

Superconducting SFQ analog-to-digital converters (ADC's) utilizing under-dampened Josephson junctions have been shown to operate at gigahertz frequencies, but exhibit excessive non-linear behavior caused by the feedback loop. The non-linearity of these systems and their utilization of an under-dampened junction introduces the oscillation problem previously discussed that decrease the clock speeds of these circuits. The need for a linear, high speed modulator in both low-pass and band-pass implementations that can achieve gigahertz sampling rates that are faster than previous systems are necessary to reach the next level of processing speed.

The present invention provides an analog-to-digital modulator for converting an analog input signal to a digital output signal. A plurality of superconducting comparators are utilized in a time-interleaved mode. Each comparator has an analog input, a clock input, a digital output, and a threshold current such that when a clock signal is applied to the clock input, each comparator samples an analog signal applied to its analog input. This generates a SFQ pulse at its digital output if the input current generated by the analog input signal is greater than the threshold current. A plurality of superconducting digital-to-analog converters (DAC's) with digital inputs and analog outputs are also used in an interleaved mode. Each DAC is constructed and arranged to convert SFQ pulses applied to its inputs into analog signals at its analog outputs. The analog signals are time-integrated functions of the SFQ pulses.

The modulator includes a superconducting feedback loop filter with a pass band and inputs that accept an external input signal, a modulator feedback signal, and filter output that provides a filter output signal. The filter is constructed and arranged to subtract the feedback signal from the external input signal and to filter the subtracted signal such that the filter output signal is attenuated when the subtracted signal is outside the pass band.

The feedback loop filter, DAC's, and superconducting comparators are arranged within a feedback loop such that the filter output signal from the feedback loop filter is communicated to the analog input of the superconducting comparators such that the comparators generate SFQ pulses at their digital outputs. The pulses are communicated to the digital inputs of the DAC's and converted to analog signals at the analog outputs. These signals are in turn combined into an integrated analog signal and communicated via the feedback loop to the modulator feedback signal input of the feedback loop filter, thereby effectively improving the resolution of the quantization performed by the comparators.

The sampling times of the comparators are arranged such that the sequence in which each comparator samples the analog signal that is applied to its input is different for each comparator. The analog signals at the analog outputs of the DAC's are generated and combined into an integrated analog signal such that each DAC contributes a different component of this integrated signal. As a result a high-performance, time-interleaved oversampling modulator for delta and delta-sigma ADC implementation is realized. The distortion of the converted signal induced by comparators and the dynamic nonlinear inductance of the primary DACs used in the feedback circuit are drastically reduced. With a suitable choice for the feedback filter, both a low-pass and a band-pass embodiment of the modulator can be achieved.

FIG. 1 shows a flow diagram of a modulator in accordance with the present invention. The ADC 10 is represented via functional blocks to include modulator 12, digital filter 14 and register 16. The analog signal at 30 being received is input to the modulator through the integrated feedback loop filter 20. The signal is then quantized by quantizer 18. The quantizer operates at a frequency higher than the Nyquist frequency by way of the high speed clock 28. The output of the quantizer is a series of one-bit words. The output is also sent to the DAC 22 located in the feedback loop of the modulator. The DAC converts the quantized signal to an analog signal and sends the analog signal back to the feedback filter. The returned signal is subtracted from the input signal and the subtracted signal is filtered. The register then resamples the signal at the Nyquist rate using the Nyquist clock 26 and outputs an n-bit word at 24.

Figure 2:
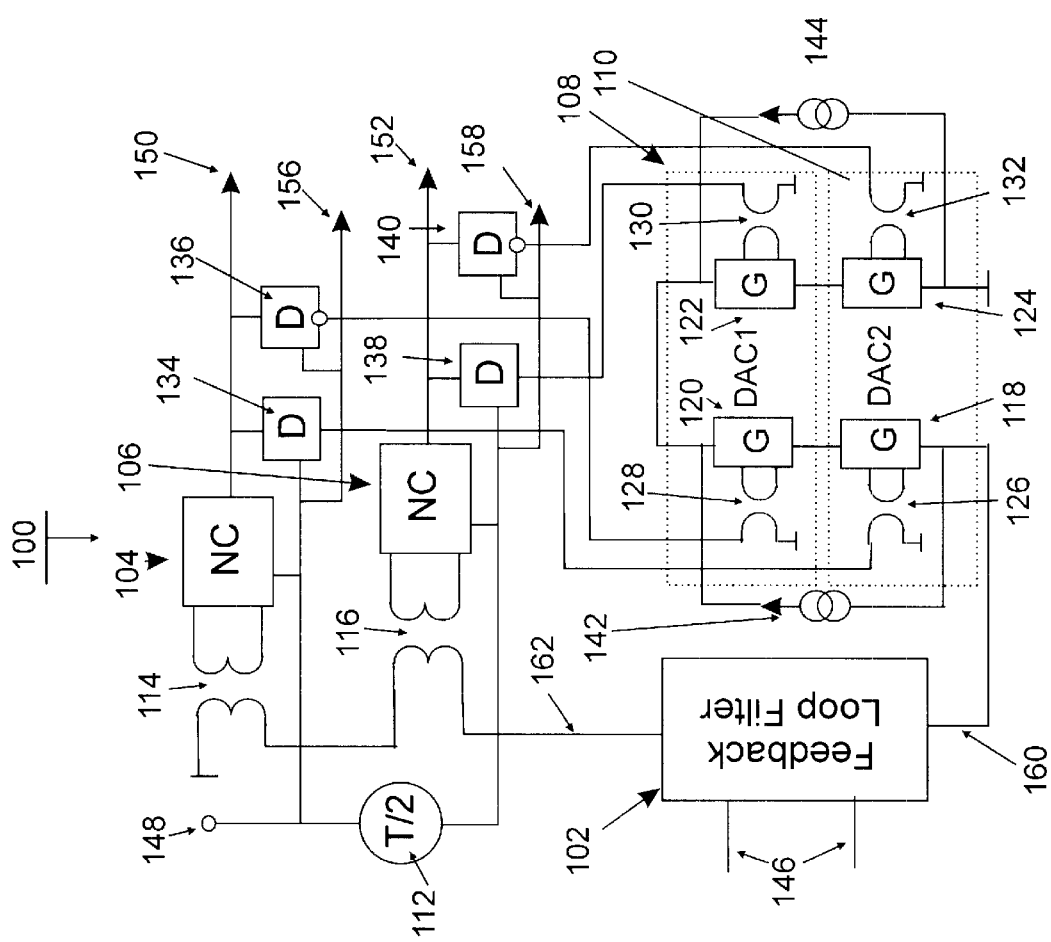
FIG. 2 is a functional diagram of one embodiment of the present invention.

FIG. 2 is a schematic diagram of the modulator 12 of FIG. 1 in accordance with the present invention. The modulator comprises a feedback loop filter 102, two comparators (NC) 104, 106, four D flip-flops 134, 136, 138, 140, and two DAC's. All of the components are interconnected within a feedback loop as described in FIG. 1. An external analog input signal is applied to input nodes 146 and filtered by feedback loop filter 102. The filtered signal is then outputted from the filter at node 162. From there it is magnetically coupled via transformer 114 and 116 in a series connection to comparators 104 and 106 respectively. The comparators, which are described in more detail in FIGS. 3 and 4 as comparator 200, perform a comparison of the current $I_{in}$ flowing via the primary coil of the transformer 114 or 116 with the threshold current $I_{sh}$. The comparison (or sampling) of the input current occurs when the SFQ clock pulse, originally applied at node 148 is applied to the clock input of the comparator. The comparator produces an SFQ pulse only if $I_{in}$ exceeds $I_{sh}$.

The magnetic coupling of the filter output to the comparators allows the filter output to remain galvanically isolated from the comparators. This prevents the withdrawal of magnetic flux from the feedback loop and allows for the use of nondestructive comparators. The term nondestructive means that the comparison performed by the comparators may cause only temporal and insignificant distortion of the input current in the primary of transformer 104 or 106. The overall effect of this non-withdrawal of magnetic flux is to enhance the linearity of the feedback circuit. Nondestructiveness is a common feature in semiconductors but a destructive comparator is generally more common than a nondestructive comparator in superconductor technologies.

The two comparators operate in a time-interleaved mode, which means that they each sample a different phase of the filter output signal. This is accomplished by feeding comparator 104 the original clock signal while feeding comparator 106 a clock signal that has been time-shifted by half the clock period. This delayed signal is produced by the delay unit 112.

Each comparator output is connected to the inputs of two D flip flops; comparator 104 connected to FF's 134 and 136, and comparator 106 connected to flip flops 138 and 140. The direct output of one flip flop and the complementary output of the other flip flop is used to relay the signal from the comparator to DAC's 108 and 110. The direct output of flip flop 134 and the complementary output of flip flop 136 are coupled to DAC 108, while the direct output of flip flop 138 and the complementary output of flip flop 140 are coupled to DAC 110. The D flip flop is one two inputs, one for data and one for the clock, and one output that either directly reflects the data input or is the inverse of the data input. Superconducting SFQ implementation of such flip flops are well known. The comparators' digital code is also outputted via output nodes 150 and 152, and the clock signals are outputted via nodes 156 and 158.

Each DAC, biased by current sources 142 and 144 has two phase generators. The phase generators 118, 120, 122, 124, which are described in more detail in FIGS. 5 and 6 as phase generator 300, convert a SFQ pulse into a time integrated signal. The time integrated signal is a component of the analog signal outputted from all the DAC's. The time integration facilitates the correct phase relationship amongst the separate signal components used to construct the analog signal. DAC 108 contains phase generators 120 and 122, while DAC 110 contains phase generators 118 and 124. To maintain the linearity of the feedback loop, the outputs of the flip flops are magnetically coupled to but galvanically isolated from the inputs of the phase generators. Each flip flop is coupled to a separate phase generator. The two flip flops 134 and 136 associated with comparator 104 are coupled to the two phase generators 120 and 122 comprising DAC 108. The direct signal and complementary signal from the output of comparator 104 are relayed to phase generators 120 and 122 respectively via flip flops 134 and 136 respectively. Similarly, the direct signal and complementary signal from the output of comparator 106 is relayed to phase generators 118 and 124 respectively via flip flops 138 and 140 respectively.

The DAC's should operate in a time-interleaved mode that is matched with that of the comparators to provide reconstruction of the analog signal with the correct phase relationship. This is done by noting that, since the gap between the two clock pulses supplied to comparator 106 contains the clock pulse supplied to comparator 104, the outputs of the phase generators associated with comparator 104 must be connected so that the component of the signal associated with comparator 104 is reconstituted in the middle of the component of the signal associated with comparator 106. This sequenced reassembly is achieved by connecting the outputs of the phase generators in series as shown in FIG. 2. The reassembled analog signal is outputted from the DAC 118 into the modulator feedback signal input of the feedback loop filter 102 via node 160 where it is subtracted from the input signal and filtered. The feedback loop filter can be either low-pass or band-pass and is described in more detail in FIGS. 7, 8 and 9.

Figure 3:
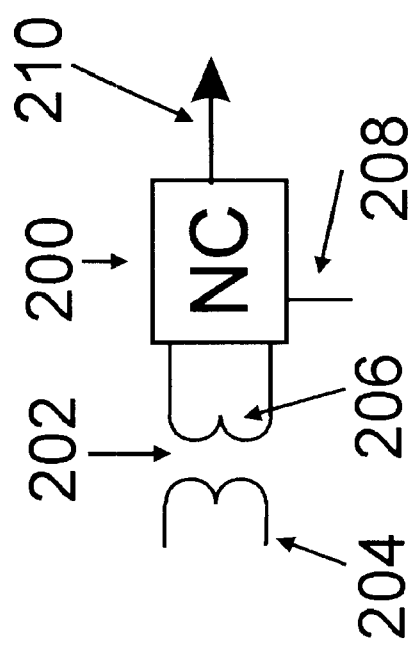
FIG. 3 is the functional block of a non-destructive comparator in accordance with the present invention.
Figure 4:
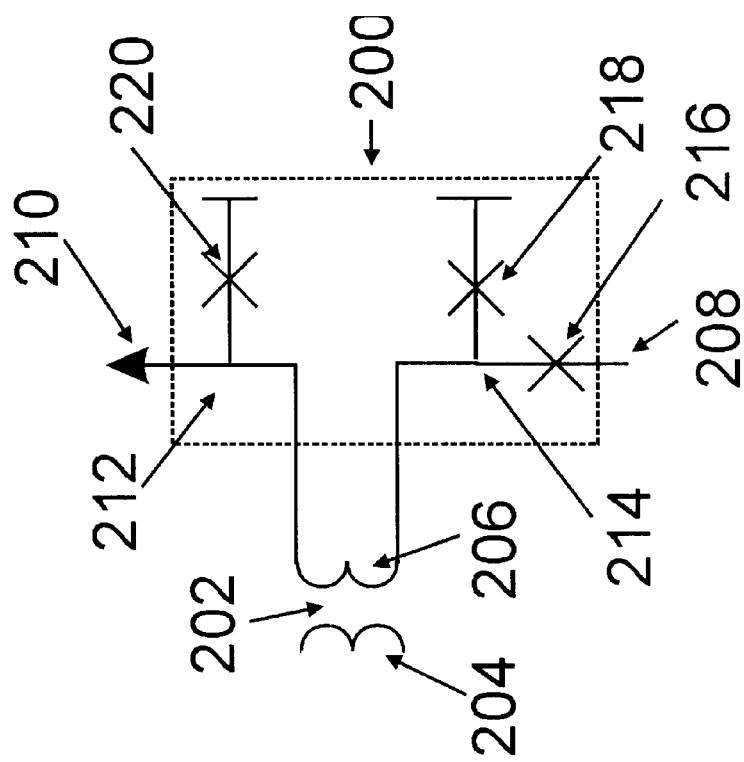
FIG. 4 is a circuit diagram of a non-destructive comparator in accordance with the present invention.

FIGS. 3 and 4 are schematics of a nondestructive comparator 200 in accordance with the present invention. Transformer 202 is used to magnetically couple an analog input signal applied to primary 204 to the comparator by inducing a current in secondary 206, which is connected to overdamped Josephson junction's 218 and 220 at nodes 214 and 212 respectively. If the sum of a clockwise induced current and the SFQ clock pulse delivered to node 208 is greater than the critical current of Josephson junction 220, a SFQ will be generated by Josephson junction 220 and outputted at node 210. Node 210 outputs a digital output code that corresponds to the analog input. If the sum of a CCW induced current and the SFQ clock pulse delivered to node 208 is greater than the critical current of Josephson junction 218, a SFQ will be generated by Josephson junction 218. This in turn will cause the generation of a SFQ by Josephson junction 220 and once again result in a pulse outputted at node 210. Josephson junction 208 is also over-damped and, in the case of spuriously large clock signals, serves to shield the other two junctions from switching by having a sufficiently low critical current so that it switches first, thereby preventing Josephson junction 218 from switching. Nominal critical currents and inductances are: Josephson junction 216—0.2 mA, Josephson junction 218 and 220—0.175 mA, secondary inductance 206—5.8 pH, primary inductance 204—200 pH, coupling factor between primary 204 and secondary 206—about 0.7.

Figure 5:
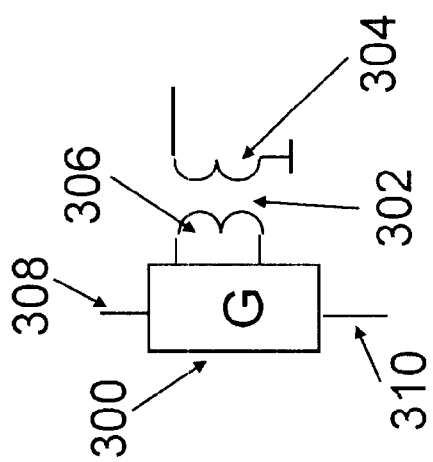
FIG. 5 is the functional block of a phase generator in accordance with the present invention.
Figure 6:
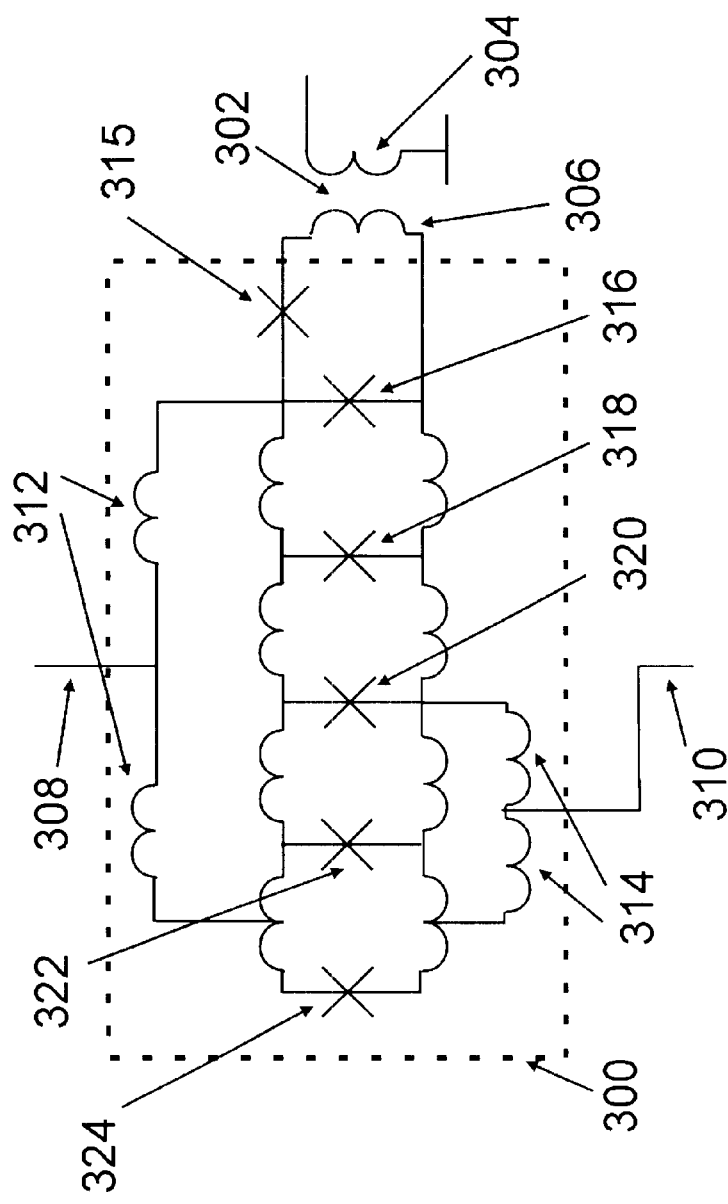
FIG. 6 is a circuit diagram of a phase generator in accordance with the present invention.

FIGS. 5 and 6 are schematics of a phase generator 300 in accordance with the present invention. Transformer 302 is used to magnetically couple a digital input signal applied to primary 304 to the phase generator by inducing a current in secondary 306, which is connected, via Josephson junction 315, to what is essentially a Josephson junction transmission line. When the sum of the induced current and the bias current from current source 142 or 144 (FIG. 2) is larger than the critical current of Josephson junction 316, it emits an SFQ. The emitted SFQ can be propagated down the line by stimulating Josephson junction 318 to switch followed by Josephson junction 320, and Josephson junction 322 and finally Josephson junction 324. As each junction switches, more magnetic flux is added to inductor 312 and then to inductor 314, with an accompanying build-up in the voltage across nodes 308 and 310. This voltage build-up is a function of the time integral of the current induced in secondary 306. Nominal critical currents and inductances are: Josephson junction 315—0.125 mA, Josephson junction 316—0.185 mA, Josephson junction 318—0.35 mA, Josephson junction 320—0.425 mA, Josephson junction 322 and Josephson junction 324 —0.5 mA, primary inductance 304—6.85 pH, primary inductance 306—6.05 pH, and mutual inductance of transformer 302—3.75 pH. The two inductances 312 are equal to each other and exceed 15 pH, and the two inductances 314 are also equal each other and exceed 15 pH. The nominal bias current is about 1.5 mA.

Figure 7:
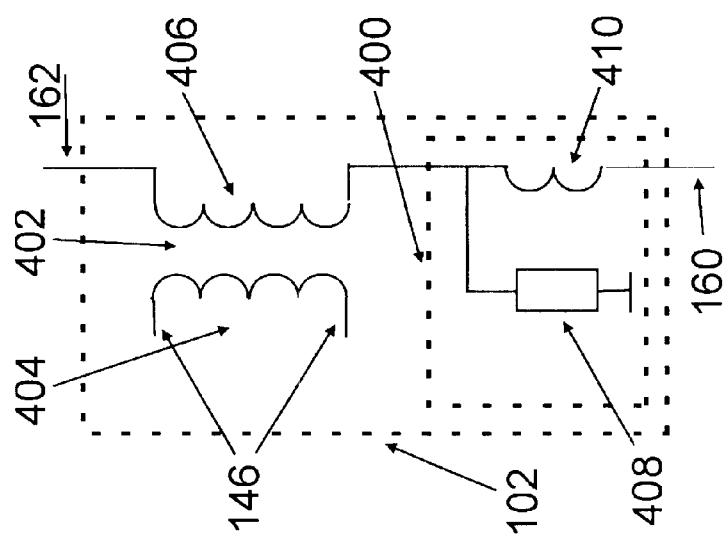
FIG. 7 is a circuit diagram of a low-pass feedback loop filter in accordance with the present invention.
Figure 8:
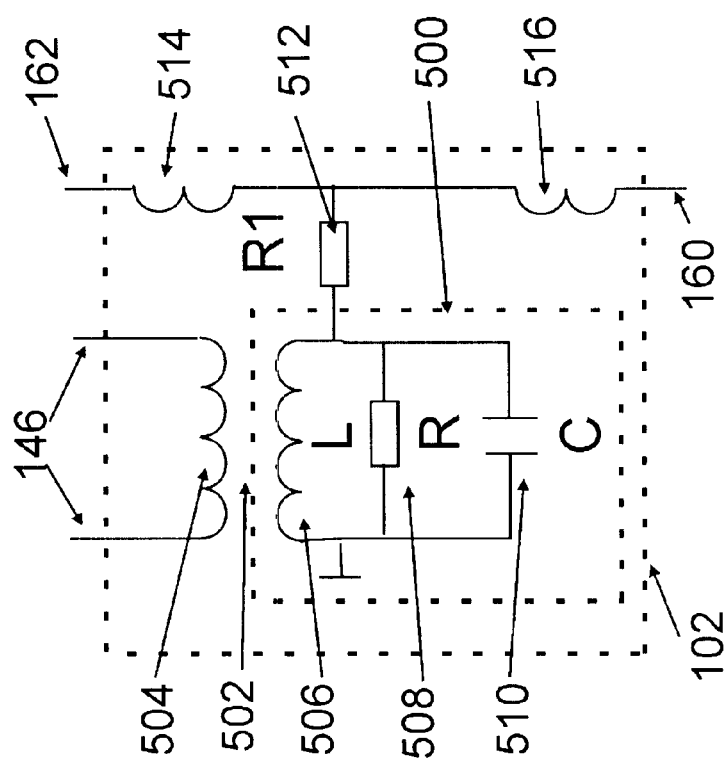
FIG. 8 is a circuit diagram of a first band-pass feedback loop filter in accordance with the present invention.
Figure 9:
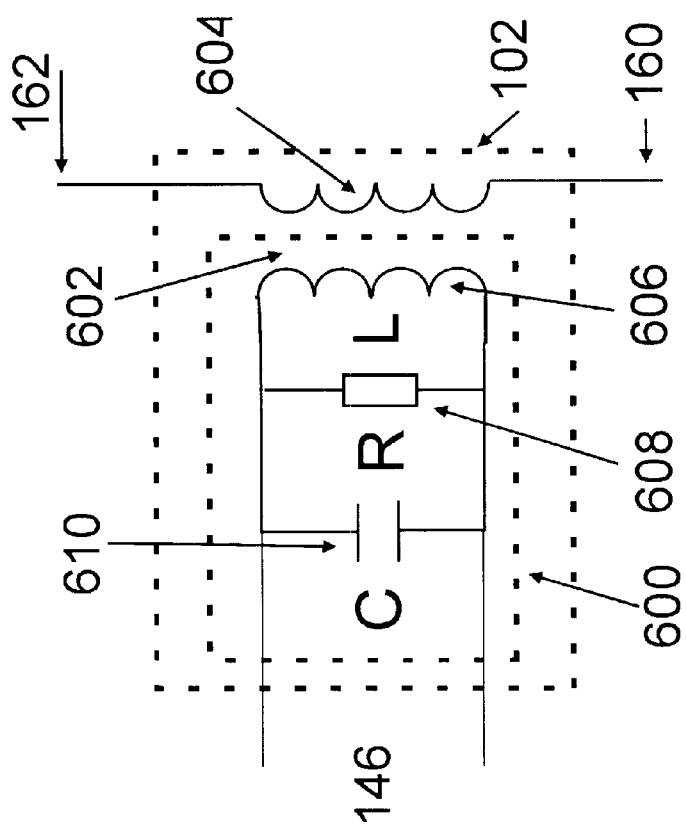
FIG. 9 is a circuit diagram of a second band-pass feedback loop filter in accordance with the present invention.

FIGS. 7, 8, and 9 show three different embodiments of a feedback loop filter in accordance with the present invention. FIG. 7 shows low-pass filter 400 comprising resistor 408 and inductor 410 connected to the secondary coil 406 of transformer 402. An analog signal from the DAC is fed to the modulator feedback signal input via node 160 and then subtracted from and filtered with an external analog input signal applied at nodes 146. Transformer 402 serves to integrate the combined signals. The output is via node 162. An optimization of the feedback transfer function is one of the most important and straightforward ways to improve the performance of a delta/delta-sigma ADC. It can be done by many different ways using known design and optimization algorithms. However this optimization requires detail knowledge of parasitic parameters, including propagation delay in digital components of the modulator as well as parasitic capacitors of comparators and DACs. In addition, a higher order low-pass filter can facilitate optimization. The important characteristics of the filter are as follows: the total inductance of the feedback loop can be a relatively high 1 nH, the time constant of the filter (for 100 MHz signal bandwidth) is about 2 ns, an the input inductance 404 (for 50 Ohm impedance of the signal source and 100 MHz signal bandwidth) is about 30 nH.

FIG. 8 shows a band-pass filter with a resonator 500 in accordance with the present invention. The resonator comprises inductor 506, resistor 508, and capacitor 510. Inductor 506 doubles as the secondary of transformer 502. An analog signal from the DAC is fed to the modulator feedback signal input via node 160 and input inductor 516 and then subtracted from and filtered with an external analog input signal applied at nodes 146. Resistor 512 is the link between the resonator and the rest of the modulator. The output is via inductor 514 and node 162. The components of the resonator are selected to provide the resonant frequency and quality that are matched correspondingly with the carrier frequency and bandwidth of the signal (for example a 2 GHz carrier frequency with a 100 MHz signal bandwidth).

FIG. 9 shows a band-pass filter with a resonator 600 in accordance with the present invention. The resonator comprises inductor 606, resistor 608, and capacitor 610. Inductor 606 doubles as the secondary of transformer 602. An analog signal from the DAC is sent to the modulator feedback signal input via node 160 and input inductor and then subtracted from and filtered with an external analog input signal applied at nodes 146. The output is via node 162. As in the prior paragraph, the components of the resonator are selected to provide the resonant frequency and quality that are matched correspondingly with the carrier frequency and bandwidth of the signal.

The present invention is not limited to utilizing the particular timed sequencing for the two comparators described above. Any time sequenced dissection of the input signal with the comparators 104 and 106 and reconstitution with the DAC's 108, 110 such that the modulators sample the input signal at different times is contemplated by the invention. In addition, the number of comparators and DAC's are not limited to two. Any number of comparators and DAC's that allow the coupling of the comparators to the DAC's as illustrated and described, or that allow the analog inputs and/or digital outputs of the comparators to be galvanically isolated from and/or magnetically coupled to the rest of the modulator is contemplated by the present invention. Further, the implementations illustrated in FIGS. 3–9 of the functional blocks shown in FIG. 2 are shown as examples and any implementation such that the described function of the functional blocks are retained is contemplated by the invention.

It can thus be appreciated that the objectives of the present invention have been fully and effectively accomplished. The foregoing specific embodiments have been provided to illustrate the structural and functional principles of the present invention and is not intended to be limiting. To the contrary, the present invention is intended to encompass all modifications, alterations, and substitutions within the spirit and scope consistent with the principles and novel features disclosed in any fashion herein.

What is claimed is:

1. An analog-to-digital modulator comprising:
   a feedback loop filter having a characteristic pass band and inputs that accept an external input signal and a modulator feedback signal, and a filter output that provides a filter output signal, the filter being constructed and arranged to subtract the feedback signal from the external input signal and to filter the subtracted signal such that the filter output signal is attenuated when the subtracted signal is outside the pass band;
   a plurality of superconducting comparators, each comparator having an analog input, a clock input, a digital output, and a characteristic threshold current, and
   a plurality of superconducting digital-to-analog converters each having a digital input and an analog output, the digital-to-analog converters being constructed and arranged to convert single flux quantum pulses applied to the inputs into analog signals at the analog outputs;
   wherein when a clock signal is applied to the clock input, each comparator samples an analog signal applied to its respective analog input, and generates a single flux quantum pulse at the digital output if the input current generated by the analog signal applied to the analog input is greater than the threshold current;
   wherein the analog signals of the digital-to-analog converter are time integrated functions of the single flux quantum pulses;
   wherein the feedback loop filter, digital-to-analog converters, and superconducting comparators are arranged within a feedback loop such that the filter output signal from the feedback loop filter is communicated to the analog input of the superconducting comparators such that the comparators generate the single flux quantum pulses at the digital outputs, which are communicated to the digital inputs of the digital-to-analog converters and therein converted to the analog signals at the analog outputs, which are in turn combined into an integrated analog signal and communicated via the feedback loop to the modulator feedback signal input of the feedback loop filter;
   wherein the sampling times of the comparators being arranged such that the sequence in which each of the comparators samples the analog signal that is applied to the analog input is different for each comparator, and
   wherein the analog signals at the analog outputs of the digital-to-analog converters, are generated and combined into the integrated analog signal such that each digital-to-analog converter contributes a different component of the integrated analog signal.

2. An analog-to-digital modulator according to claim 1 wherein the filter output is galvanically isolated from the analog inputs of the comparators.

3. An analog-to-digital modulator according to claim 2 wherein the comparator outputs are galvanically isolated from the digital inputs of the digital-to-analog converters.

4. An analog-to-digital modulator according to claim 3:
   wherein each digital-to-analog converter comprises a first and a second phase generator;
   wherein each phase generator converts an applied single flux quantum pulse into a time-integrated function of the applied pulse, and
   wherein each comparator is connected to the first and the second phase generators.

5. An analog-to-digital modulator according to claim 4 wherein the outputs of all the phase generators of all the digital-to-analog converters are connected together in series.

6. An analog-to-digital modulator according to claim 5 wherein the filter output is coupled to the analog inputs of the comparators in series.

7. An analog-to-digital modulator according to claim 6:
   wherein the threshold current is identical for all the superconducting comparators, and
   wherein each comparator contains at least three over-damped Josephson junctions.

8. An analog-to-digital modulator according to claim 7 wherein each digital-to-analog converter contains at least two over-damped Josephson junctions.

9. An analog-to-digital modulator according to claim 1 wherein the digital outputs of the comparators are galvanically isolated from the digital inputs of the phase generators.

10. An analog-to-digital modulator according to claim 1:
    wherein each digital-to-analog converter comprises a first and a second phase generator;
    wherein each phase generator converts an applied single flux quantum pulse into a time-integrated function of the applied pulse, and
    wherein each comparator is connected to the first and the second phase generators of a matching digital-to-analog converter.

11. An analog-to-digital modulator according to claim 10 further comprising a first and a second superconducting flip-flop coupled between the digital output of each comparator and the first and the second phase generator of the matching digital-to-analog converter respectively such that the first flip-flop communicates the single flux quantum pulse from the comparator to the first phase generator and the second flip-flop communicates the compliment of the single flux quantum pulse to the second phase generator.

12. An analog-to-digital modulator according to claim 1 wherein the external input signal is galvanically isolated from the modulator.

13. An analog-to-digital modulator according to claim 1 wherein the integrated feedback loop filter is one of a low-pass filter and a band-pass filter implemented with passive components.

14. An analog-to-digital modulator according to claim 1 wherein the external input signal is magnetically coupled to the modulator via a transformer having a primary inductance and a secondary inductance.

15. An analog-to-digital modulator according to claim 14 wherein the integrated feedback loop filter is one of a low-pass filter and a band-pass filter, and the integrated feedback loop filter includes the secondary inductance of the transformer.

16. An analog-to-digital modulator comprising:
    a feedback loop filter having a characteristic pass band and inputs that accept an external input signal and a modulator feedback signal, and a filter output that provides a filter output signal;
    a superconducting comparator comprising an analog input, a clock input, a digital output, and a threshold current, and a superconducting digital-to-analog converter with digital inputs and an analog output, the digital-to-analog converter being constructed and arranged to convert single flux quantum pulses applied to the inputs into analog signals at the analog output;

wherein the filter is constructed and arranged to subtract the feedback signal from the external input signal and to filter the subtracted signal such that the filter output signal is attenuated when the subtracted signal is outside the pass band;

wherein when a clock signal is applied to the clock input, each comparator samples an analog signal applied to the analog input, and generates a single flux quantum pulse at the digital output if the input current generated by the analog signal applied to the analog input is greater than the threshold current;

wherein the analog signals are time integrated functions of the single flux quantum pulses;

wherein the feedback loop filter, digital-to-analog converter, and superconducting comparator arranged within a feedback loop such that the filter output signal from the feedback loop filter is communicated to the analog input of the superconducting comparator such that the comparator generates the single flux quantum pulses at the digital output, which are communicated to the digital inputs of the digital-to-analog converter and therein converted to the analog signals at the analog output, which is in turn communicated via the feedback loop to the modulator feedback signal input of the feedback loop filter, and wherein the filter output being galvanically isolated from the analog input of the comparator.

17. An analog-to-digital modulator according to claim 16 wherein the digital output of the comparator is galvanically isolated from the digital input of the digital-to-analog converter.

18. An analog-to-digital modulator according to claim 17 wherein the external input signal is galvanically isolated from the modulator.

19. An analog-to-digital modulator according to claim 17 where the external input signal is magnetically coupled to the modulator via a transformer having a primary inductance and a secondary inductance.

20. An analog-to-digital modulator according to claim 19 wherein the integrated feedback loop filter is one of a low-pass filter and a band-pass filter, and the integrated feedback loop filter includes the secondary inductance of the transformer.

21. A method for converting an analog input to a digital output comprising:

receiving the analog input signal and a modulator feedback signal at respective inputs of a feedback loop filter, the filter having a characteristic pass band and outputting at a filter output a filter output signal;

subtracting the feedback signal from the analog input signal;

filtering the subtracted signal such that the filter output signal is attenuated when the subtracted signal is outside the pass band;

receiving the filter output signal at an input of a superconducting comparator, the comparator having an analog input, a clock input, a digital output, and a characteristic threshold current;

sampling the analog signal applied to the analog input of the comparator when a clock signal is applied to the clock input;

generating a single flux quantum pulse at the digital output of the comparator if the input current generated by the analog signal applied to the analog input is greater than the threshold current of the comparator;

receiving the digital output signal at the input of a superconducting digital-to-analog converter, the digital-to-analog converter having a digital input and an analog output;

converting single flux quantum pulses applied to the input of the digital-to-analog converter into analog signal at the analog output;

communicating the analog signal of the digital-to-analog converter via a feedback loop to the modulator feedback signal input of the feedback loop filter;

wherein the analog signal of the digital-to-analog converter are time integrated functions of the single flux quantum pulses, and wherein the camparator and the digital-to-analog converter comprise over-damped Josephson junctions.

22. A method according to claim 21 further comprising:

receiving the filter output signal by one of a plurality of comparators;

receiving the digital output signal by one of a plurality of digital-to-analog converters, each digital-to-analog converter being coupled to and associated with a respective comparator;

combining the analog outputs of the digital-to-analog converters into an integrated analog signal in such a way that each digital-to-analog converter contributes a different component of the integrated analog signal.

sampling the input signal of the comparator such that the sequence in which each of the comparators samples the analog signal that is applied to the analog input is different for each comparator.

* * * * *

UNITED STATES PATENT AND TRADEMARK OFFICE
CERTIFICATE OF CORRECTION

| | | |
|---|---|---|
| PATENT NO. | : 6,608,581 B1 | Page 1 of 1 |
| APPLICATION NO. | : 09/883490 | |
| DATED | : August 19, 2003 | |
| INVENTOR(S) | : Vasili Semenov | |

It is certified that error appears in the above-identified patent and that said Letters Patent is hereby corrected as shown below:

Column 1, Line 10    Insert --FEDERALLY FUNDED RESEARCH

This invention was made with Government support under Contract Number N00014-01-C-0015 awarded by the Department of the Navy. The Government has certain rights in the invention.--

Signed and Sealed this

Twentieth Day of February, 2007

JON W. DUDAS
*Director of the United States Patent and Trademark Office*